US011158708B1

(12) United States Patent
Sun et al.

(10) Patent No.: US 11,158,708 B1
(45) Date of Patent: Oct. 26, 2021

(54) GRAPHENE CHANNEL SILICON CARBIDE POWER SEMICONDUCTOR TRANSISTOR

(71) Applicant: SOUTHEAST UNIVERSITY, Jiangsu (CN)

(72) Inventors: Weifeng Sun, Jiangsu (CN); Siyang Liu, Jiangsu (CN); Lizhi Tang, Jiangsu (CN); Sheng Li, Jiangsu (CN); Chi Zhang, Jiangsu (CN); Jiaxing Wei, Jiangsu (CN); Shengli Lu, Jiangsu (CN); Longxing Shi, Jiangsu (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 314 days.

(21) Appl. No.: 16/486,494

(22) PCT Filed: Sep. 25, 2018

(86) PCT No.: PCT/CN2018/107329

§ 371 (c)(1),
(2) Date: Aug. 15, 2019

(87) PCT Pub. No.: WO2020/000713

PCT Pub. Date: Jan. 2, 2020

(30) Foreign Application Priority Data

Jun. 27, 2018 (CN) ......................... 201810682926.1

(51) Int. Cl.
*H01L 29/16* (2006.01)
*H01L 29/78* (2006.01)
*H01L 29/06* (2006.01)

(52) U.S. Cl.
CPC ...... *H01L 29/1606* (2013.01); *H01L 29/0607* (2013.01); *H01L 29/1608* (2013.01); *H01L 29/7802* (2013.01)

(58) Field of Classification Search
CPC .............. H01L 29/1606; H01L 29/7802–7815
See application file for complete search history.

(56) References Cited

U.S. PATENT DOCUMENTS

| | | | |
|---|---|---|---|
| 6,246,077 B1 | 6/2001 | Kobayashi et al. | |
| 2009/0090919 A1 | 4/2009 | Uchida | |
| 2012/0261673 A1* | 10/2012 | Schulze | H01L 29/1608 257/77 |

FOREIGN PATENT DOCUMENTS

| | | |
|---|---|---|
| CN | 102449732 | 5/2012 |
| CN | 104465765 | 3/2015 |

OTHER PUBLICATIONS

"International Search Report (Form PCT/ISA/210) of PCT/CN2018/107329," dated Apr. 8, 2019, pp. 1-4.

* cited by examiner

*Primary Examiner* — Daniel P Shook
(74) *Attorney, Agent, or Firm* — JCIPRNET

(57) ABSTRACT

The invention provides a graphene channel silicon carbide power semiconductor transistor, and its cellular structure thereof. Characterized in that, a graphene strip serving as a channel is embedded in a surface of the P-type body region and two ends of the graphene strip are respectively contacted with a boundary between the N+-type source region and the P-type body region and a boundary between the P-type body region and the N-type drift region, and the graphene strip is distributed in a cellular manner in a gate width direction, a conducting channel of a device is still made of graphene; in the case of maintaining basically invariable on-resistance and current transmission capacity, the P-type body regions are separated by the graphene strip, thus enhancing a function of assisting depletion, which further reduces an overall off-state leakage current of the device, and improves a breakdown voltage.

6 Claims, 16 Drawing Sheets

GRAPHENE CHANNEL SILICON CARBIDE POWER SEMICONDUCTOR TRANSISTOR

CROSS-REFERENCE TO RELATED APPLICATION

This application is a 371 of international application of PCT application serial no. PCT/CN2018/107329, filed on Sep. 25, 2018, which claims the priority benefit of China application no. 201810682926.1, filed on Jun. 27, 2018. The entirety of each of the above mentioned patent applications is hereby incorporated by reference herein and made a part of this specification.

BACKGROUND OF THE INVENTION

1. Technical Field

The present invention belongs to the field of high-voltage power semiconductor devices, and more particularly, to a graphene channel silicon carbide power semiconductor device.

2. Background Art

Graphene is a single-layer carbon polymer with a conduction band and a valence band met at a Dirac point, and is called a zero-band gap semiconductor. As a new material, the graphene has the features of extremely high carrier mobility, submicron-scale ballistic transmission characteristic at room temperature, quantum Hall effect, excellent mechanical property, electron spin transport, superconductivity, etc., and is known as the most ideal electrode and semiconductor material, thus enabling the graphene to have a very broad development prospect in the direction of nano-electronics and spintronics components. At present, the graphene material industry has basically taken shape and is mainly used in the fields such as photoelectric semiconductors, biomedicine, aerospace and military industries, sensors and microelectronic devices. The application of the new material graphene in silicon carbide power devices with characteristics of wide forbidden band, high critical breakdown electric field, high thermal conductivity, high power density and low switching loss can further improve the performance of electrical devices and make them have greater application potential in high temperature, high frequency, high power, photoelectron and radiation resistant devices. In view of the broad application prospect, in-depth research work has been carried out both at home and abroad.

FIG. 1 illustrates a conventional graphene channel silicon carbide power semiconductor device, which comprises an N-type substrate (N sub), wherein one side of the N-type substrate is provided with a drain metal, the other side of the N-type substrate is an N-type drift region (N drift), P-type body regions (P body), N+-type source regions and P+-type body contact regions are symmetrically arranged at two ends of the N-type drift region, a gate oxide layer is arranged on surfaces of the P-type body regions and the N-type drift region, a continuous graphene layer is arranged above the P-type body region and inside a gate oxide, the graphene layer is contacted with the P-type body region, a polysilicon gate is arranged on a surface of the gate oxide layer, a passivation layer above wraps the polysilicon gate, and a source metal is arranged above the N+-type source region and the P+-type body contact region. When a certain positive voltage is applied to the drain electrode, electrons are injected into the N-type drift region and the N-type substrate from the N+-type source region through the graphene channel above the P-type body region under an effect of a positive drain voltage, and finally reach a drain end. In the conventional graphene channel silicon carbide power semiconductor device, the graphene channel on the surface is directly conductive, and the device has the features of low on-resistance, strong current transmission capability and the like. However, the continuous high mobility graphene layer has large current density, and the conducting channel of the device cannot be completely exhausted under the conditions of high leakage voltage and zero gate voltage, resulting in a large off-state leakage current, a low breakdown voltage and low reliability.

SUMMARY

Aiming at the problems above, the present invention provides a graphene channel silicon carbide power semiconductor transistor which can enhance a function of assisting depletion, thus further reducing an overall off-state leakage current of the device, and improving a breakdown voltage.

The technical solutions employed in the present invention are as follows.

A graphene channel silicon carbide power semiconductor transistor comprises an N-type substrate, wherein one side of the N-type substrate is connected with a drain metal, and the other side of the N-type substrate is provided with an N-type drift region, P-type body regions are respectively arranged at two ends of the N-type drift region, a P+-type body contact region and an N+-type source region are respectively arranged in each of the P-type body regions, a gate oxide layer is arranged on a surface of the N-type drift region, and two ends of the gate oxide layer are respectively extended into the P-type body regions at the two sides, a polysilicon gate is arranged on a surface of the gate oxide layer, a passivation layer is arranged on the polysilicon gate, and the passivation layer wraps two sides of the polysilicon gate, a source metal is arranged on the N+-type source region and the P+-type body contact region, a graphene strip serving as a channel of the transistor is arranged in the P-type body region, and two ends of the graphene strip are respectively contacted with a boundary between the N+-type source region and the P-body region and a boundary between the P-type body region and the N-type drift region, and the graphene strip is embedded in a surface of the P-type body region.

Further, the graphene array can be arranged to extend from an intersection of the N+-type source region and the P-type body region to the N-type drift region at intervals in a gate length direction, and the graphene is distributed in a continuous or interval cross manner in a gate width direction as shown in FIG. 4.

Compared with the prior art, the present invention has the following advantages.

According to the present invention, the graphene strip is embedded in the surface of the P-type body region, and the graphene is contacted with the surface of the gate oxide, and is distributed in a cellular manner in the gate width direction; at the moment, a conducting channel of a device is still made of the graphene, and in the case of maintaining basically invariable on-resistance and current transmission capacity, the P-type body regions are separated by the graphene strip, thus enhancing the function of assisting depletion, which further reduces the overall off-state leakage current of the device, and improves the breakdown voltage.

(1) The graphene strip is distributed in a cellular manner, so that the P-type body regions are separated, and are in multi-surface contact with the graphene, and in the case of a zero gate voltage and a high leakage voltage, electrons are present in the graphene and are recombined with majority carrier holes of the P-type body region to form a space charge region, thus enhancing the function of assisting depletion, which further reduces the overall off-state leakage current of the device. Therefore, compared with a semiconductor device with graphene continuously distributed in the gate oxide, the device has a smaller off-state leakage current, a higher breakdown voltage and stronger reliability.

(2) The cellular graphene array is embedded in the P-type body region; when a positive voltage is applied to a drain electrode of the device, majority carrier electrons of the N+-type source region will be directly injected into the N-type drift region and the N-type substrate through the graphene channel and finally reach a drain end to form a current path. Due to different carrier mobilities of the silicon carbide and the graphene, when the graphene is distributed at intervals in the gate oxide, the device has a higher on-resistance and uneven current transmission. Therefore, compared with a device with graphene distributed at intervals in the gate oxide, the device has a lower on-resistance, a better on-state I-V characteristic, and a stronger current transmission capability. Compared with a device with graphene continuously distributed in the gate oxide, the present invention has a basically unchanged on-resistance and a basically unchanged current transmission capability.

(3) A silicon carbide epitaxial growth method is one of the methods for preparing the graphene, and a silicon carbide single crystal is heated at high temperature to cause graphitization, thus obtaining the graphene with excellent performance based on a silicon carbide substrate, which is compatible with the existing device preparation process.

(4) Since a carrier mobility of a graphene material is less affected by temperature, the graphene channel is adopted in the proposed graphene channel silicon carbide power semiconductor transistor, carrier transmission in the channel is less affected by temperature, and on-resistance stability is better at high temperature.

DETAILED DESCRIPTION OF THE EMBODIMENTS

Figure 1:
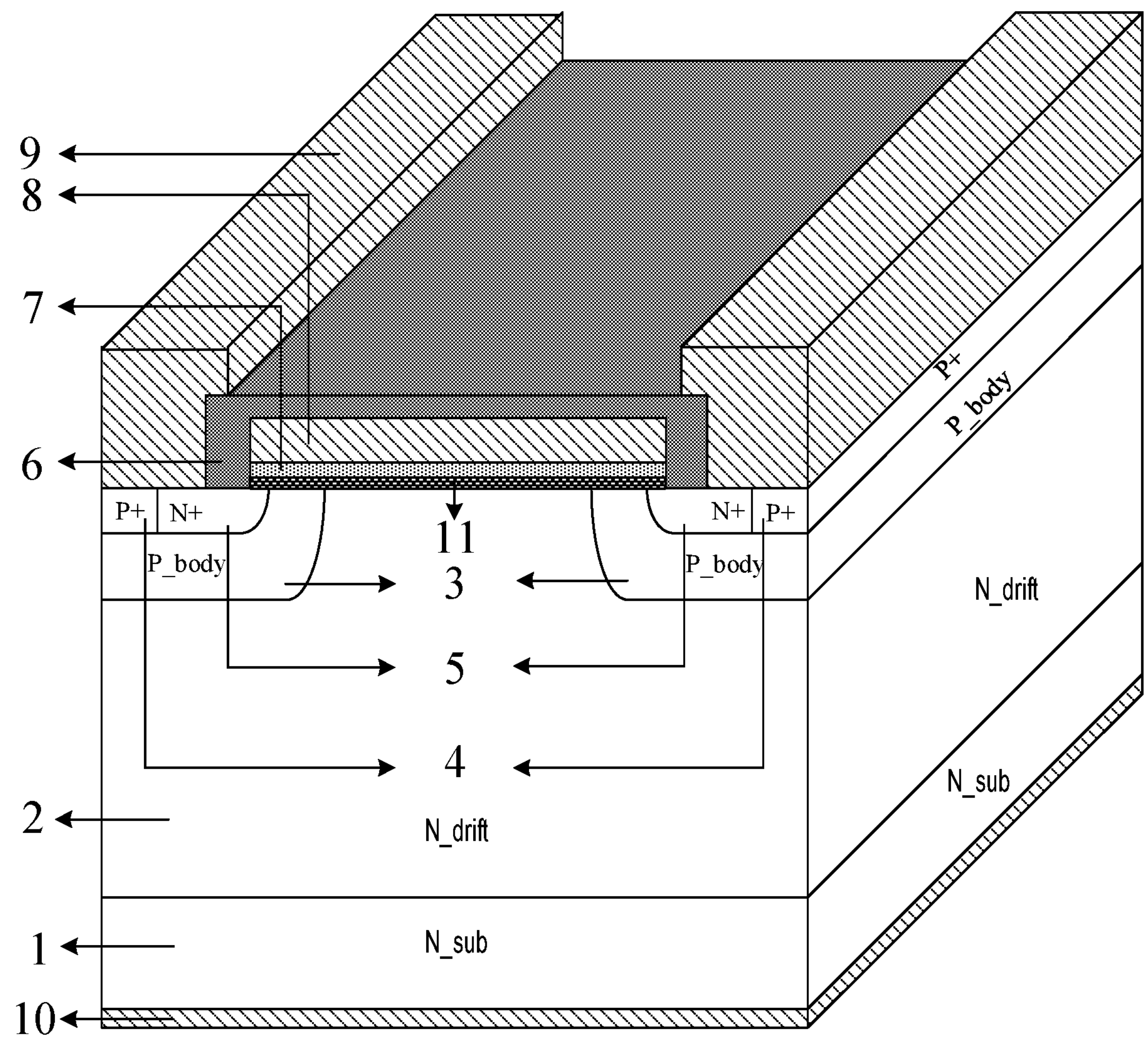
FIG. 1 is a stereoscopic diagram illustrating a structure of a conventional graphene channel silicon carbide power semiconductor device with graphene continuously distributed in a gate oxide.
Figure 2:
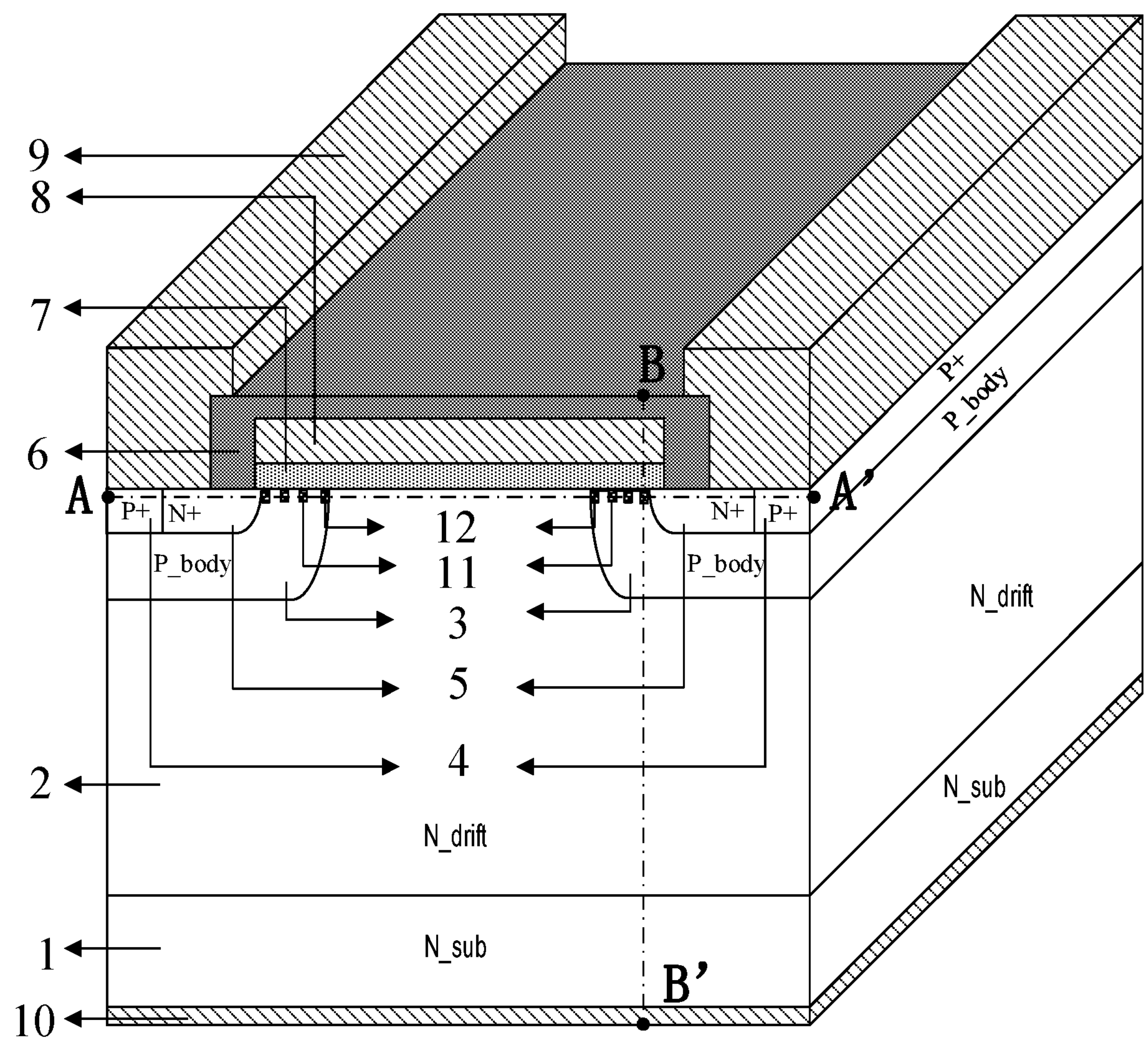
FIG. 2 is a stereoscopic diagram illustrating a structure of the present invention.
Figure 3:
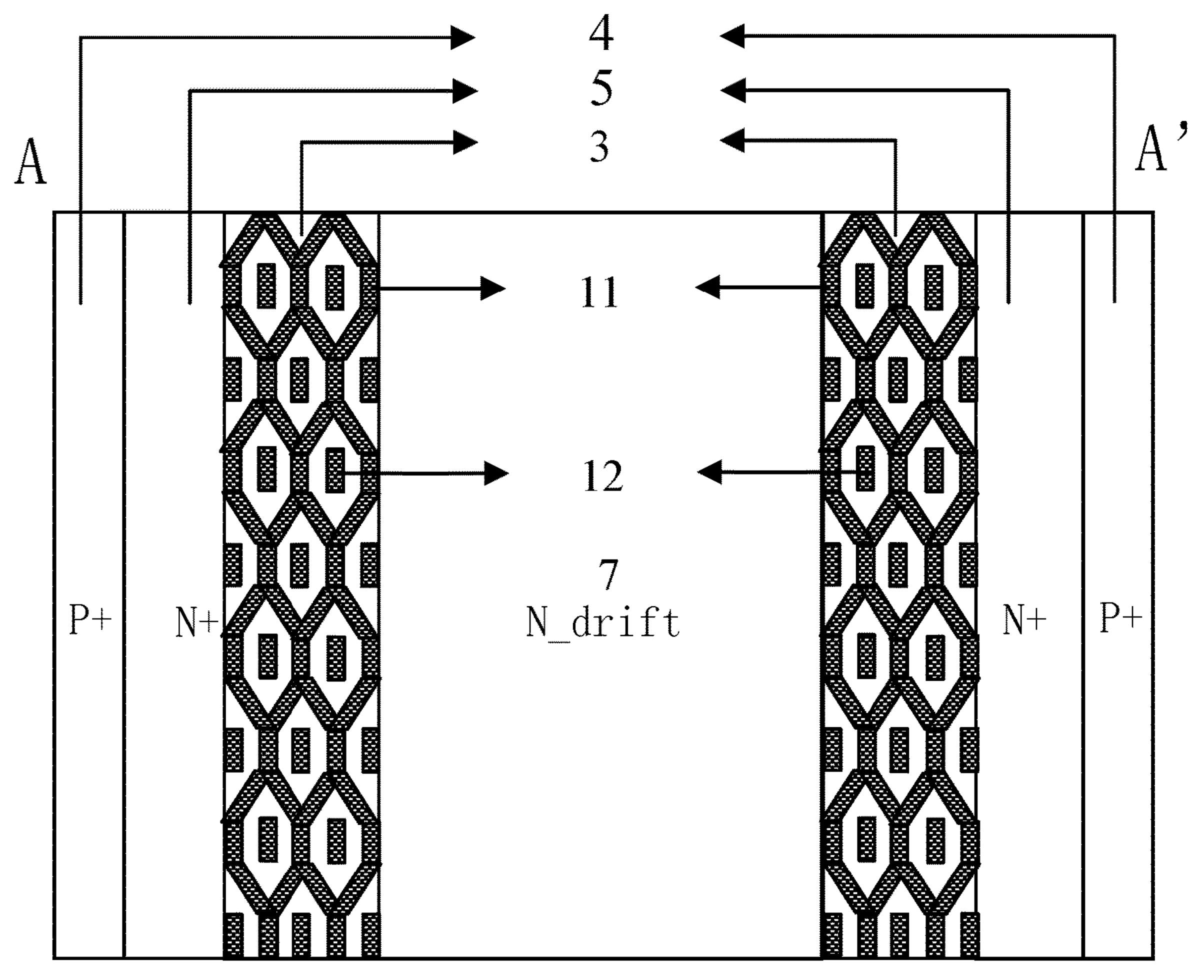
FIG. 3 is a top cross-sectional view of an embodiment of the present invention distributed in a cellular manner along an A-A' straight line parallel to a gate width direction.
Figure 4:
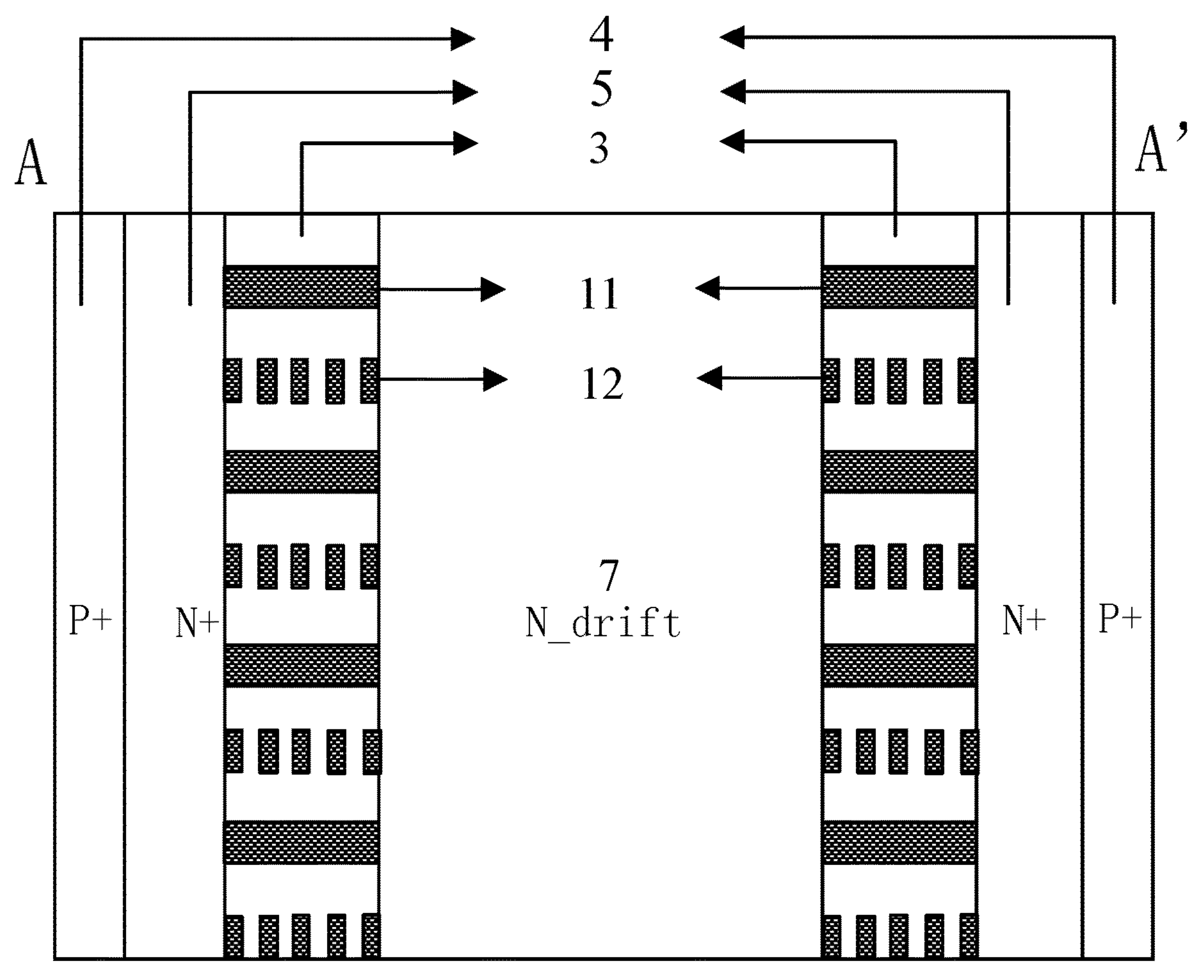
FIG. 4 is a top cross-sectional view of another embodiment of the present invention distributed along the A-A' straight line parallel to the gate width direction.
Figure 5:
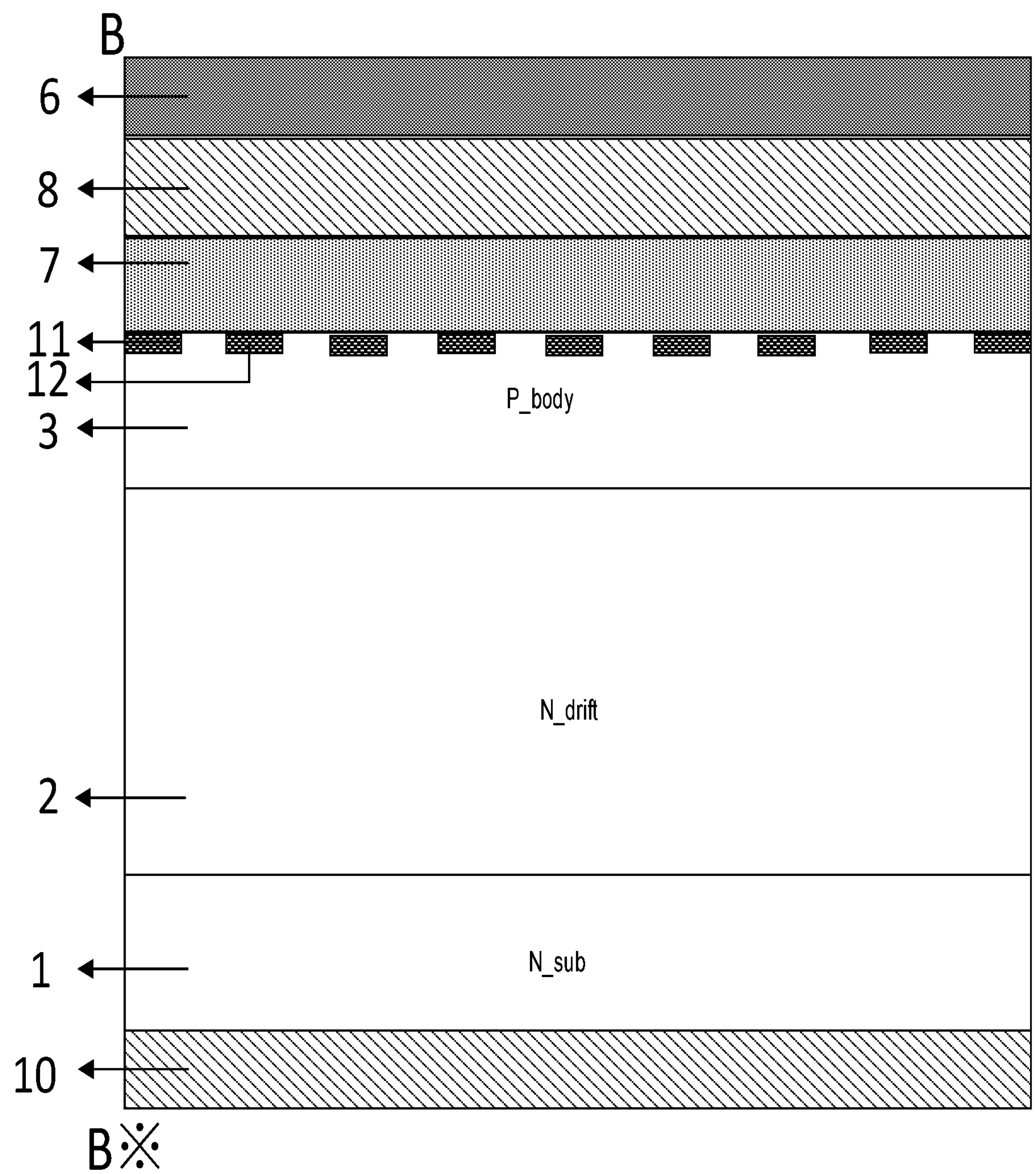
FIG. 5 is a stereoscopic side-sectional view of the present invention distributed along a B-B' straight line parallel to the gate width direction.
Figure 6:
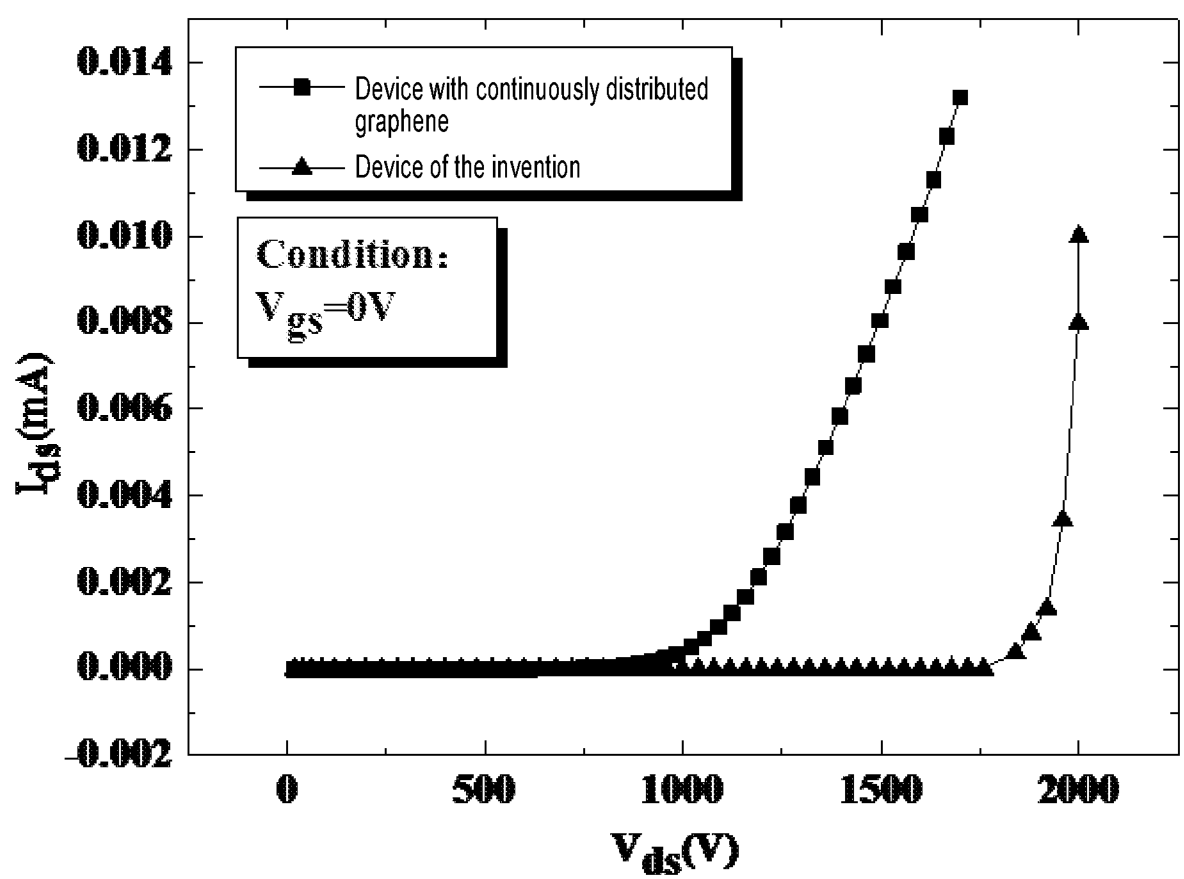
FIG. 6 illustrates breakdown characteristics of the present invention and a silicon carbide power semiconductor device with graphene continuously distributed when a gate voltage is 0 V, and it can be seen that the device of the present invention has a smaller leakage current and a larger breakdown voltage.
Figure 7:
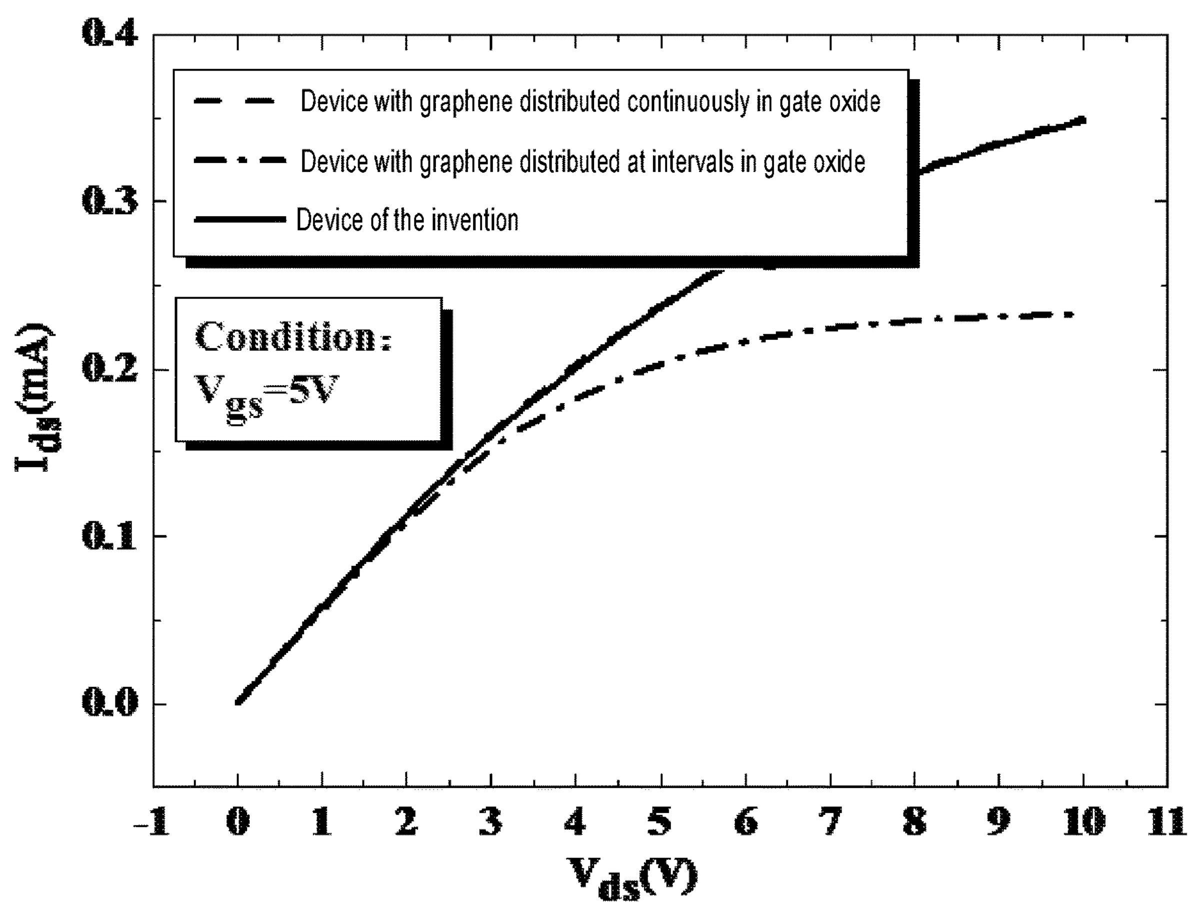
FIG. 7 is an I-V curve comparison diagram of a graphene channel silicon carbide power semiconductor device provided by the present invention which is distributed continuously or at intervals in the gate oxide when the gate voltage is 5 V, and it can be seen that, compared with a device with graphene continuously distributed in the gate oxide, the device of the present invention has a basically unchanged on-resistance and an unchanged current transmission capability; and compared with a device with graphene distributed at intervals in the gate oxide, the device has an obviously reduced on-resistance and an enhanced current transmission capability.
Figure 8:
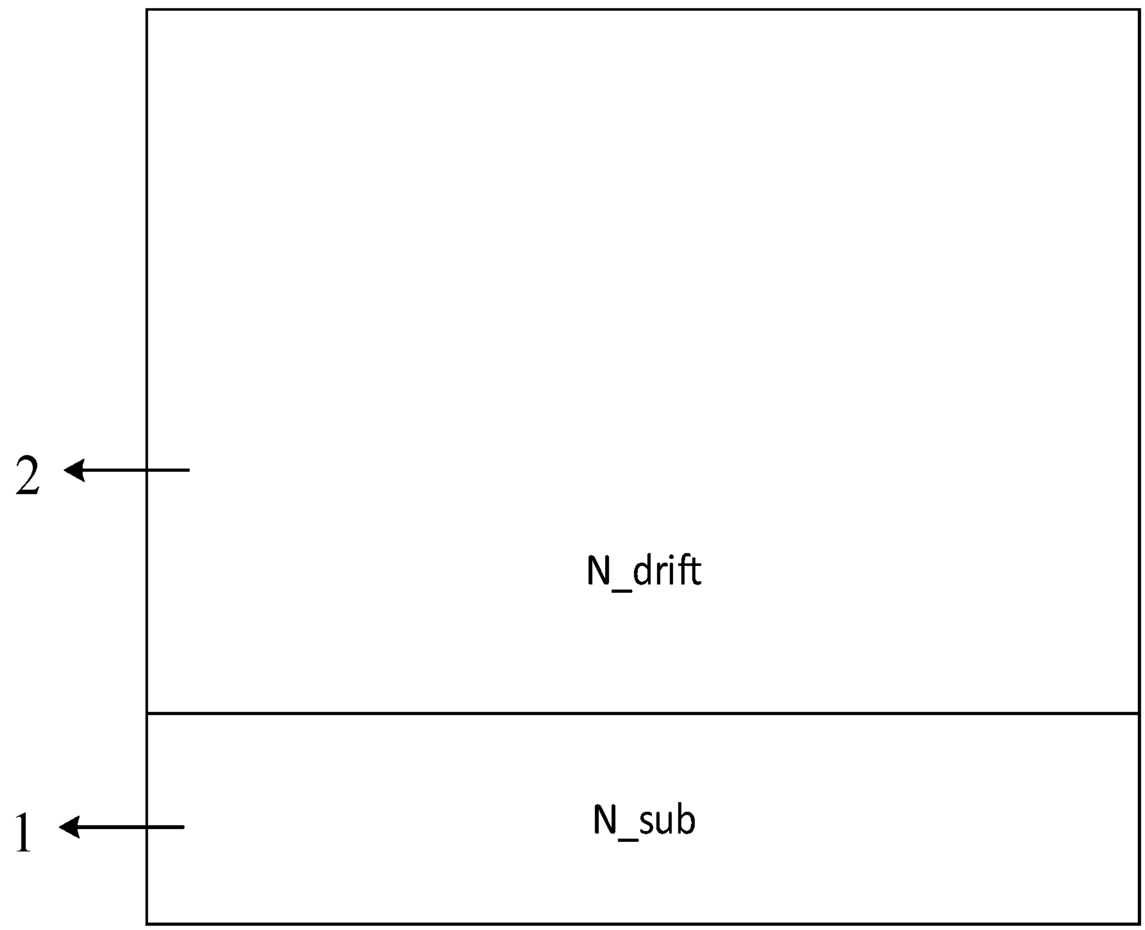
FIG. 8 is a structure diagram of a silicon carbide epitaxial layer formed on an N-type substrate of silicon carbide by a manufacturing method of the present invention.
Figure 9:
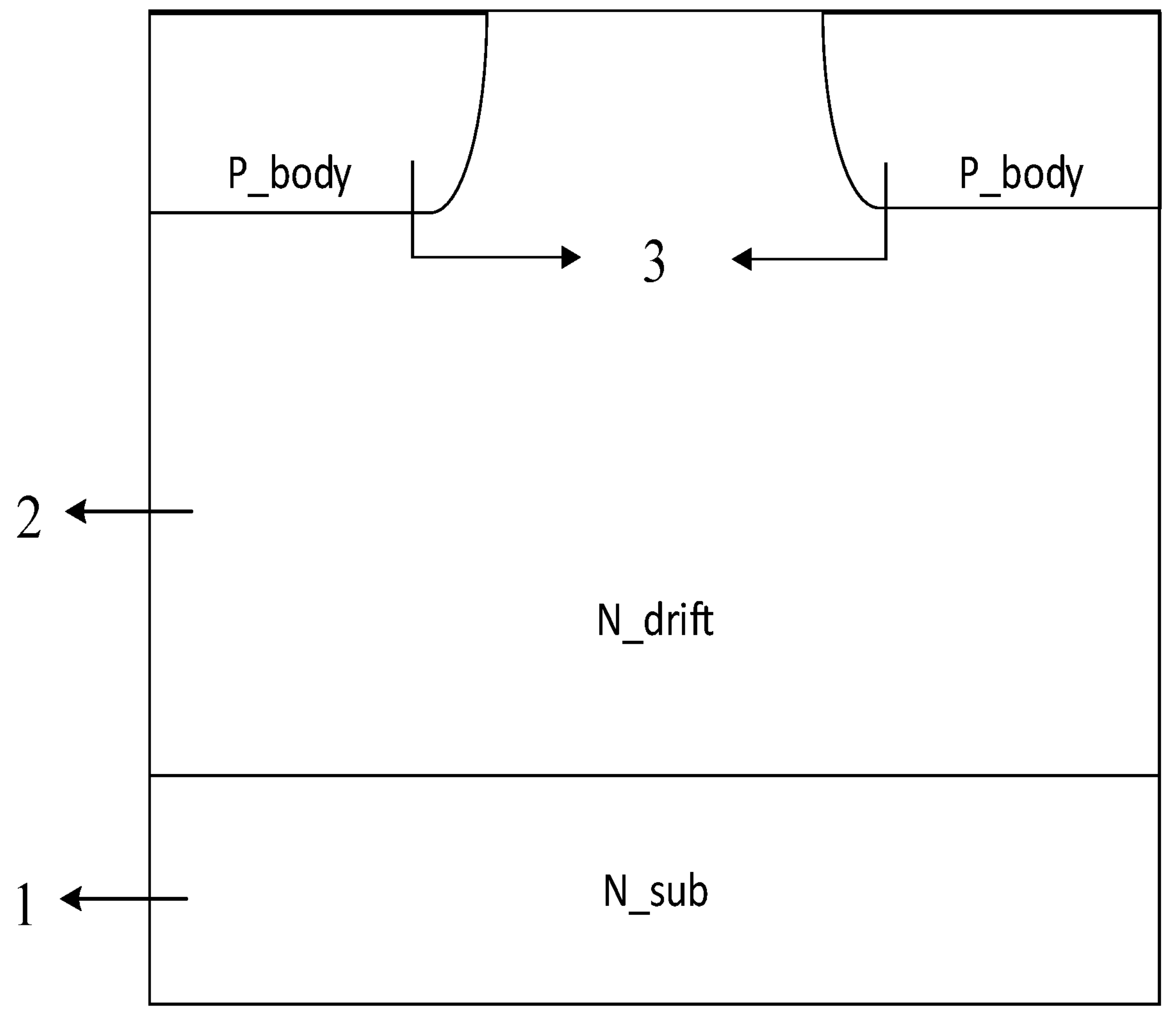
FIG. 9 is a structure diagram of P-type body regions of the silicon carbide formed in an N-type drift region through photolithography and ion injection by the manufacturing method of the present invention.
Figure 10:
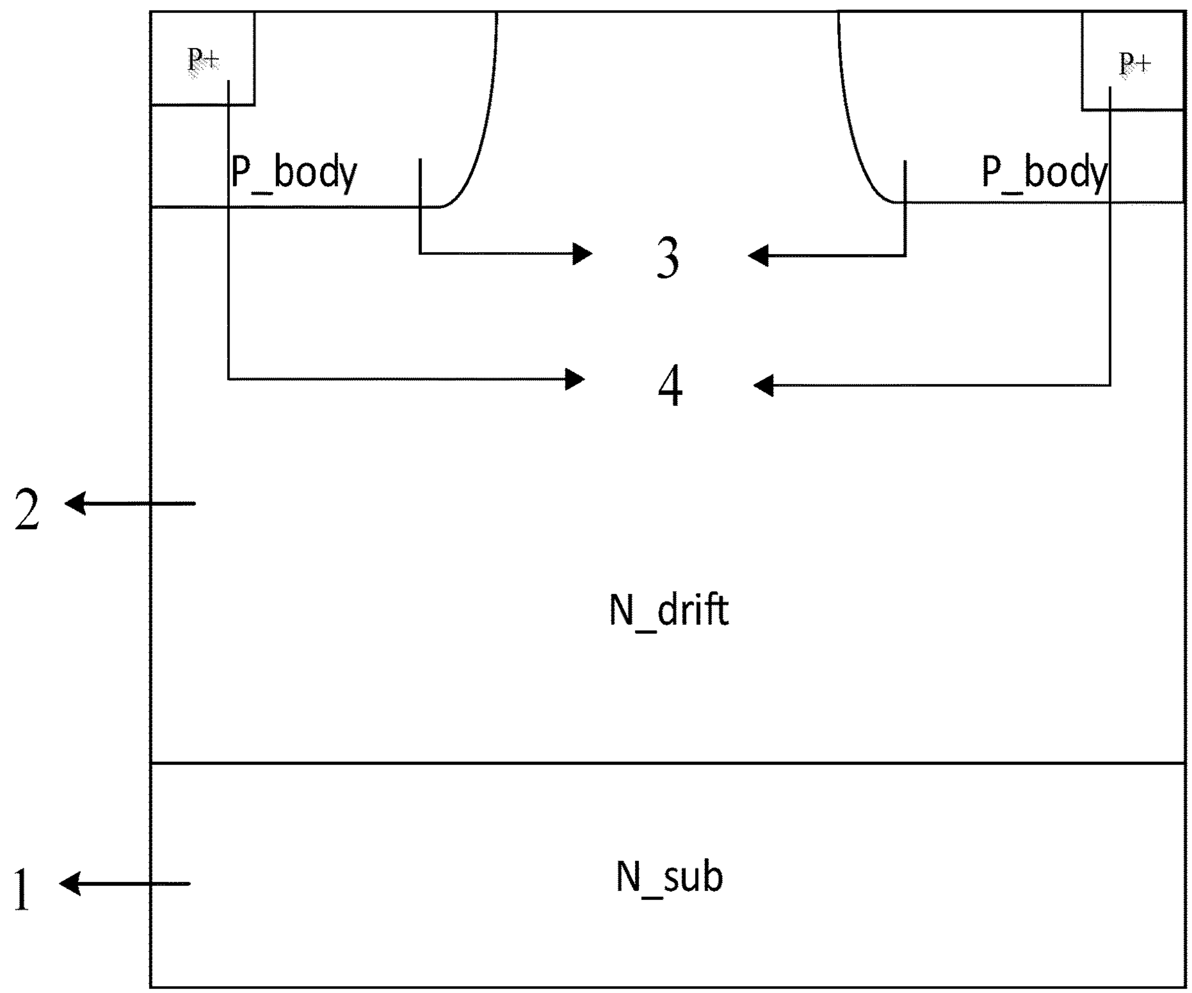
FIG. 10 is a structure diagram of P+-type body contact regions of the silicon carbide formed in the P-type body regions of the silicon carbide through photolithography and ion injection by the manufacturing method of the present invention.
Figure 11:
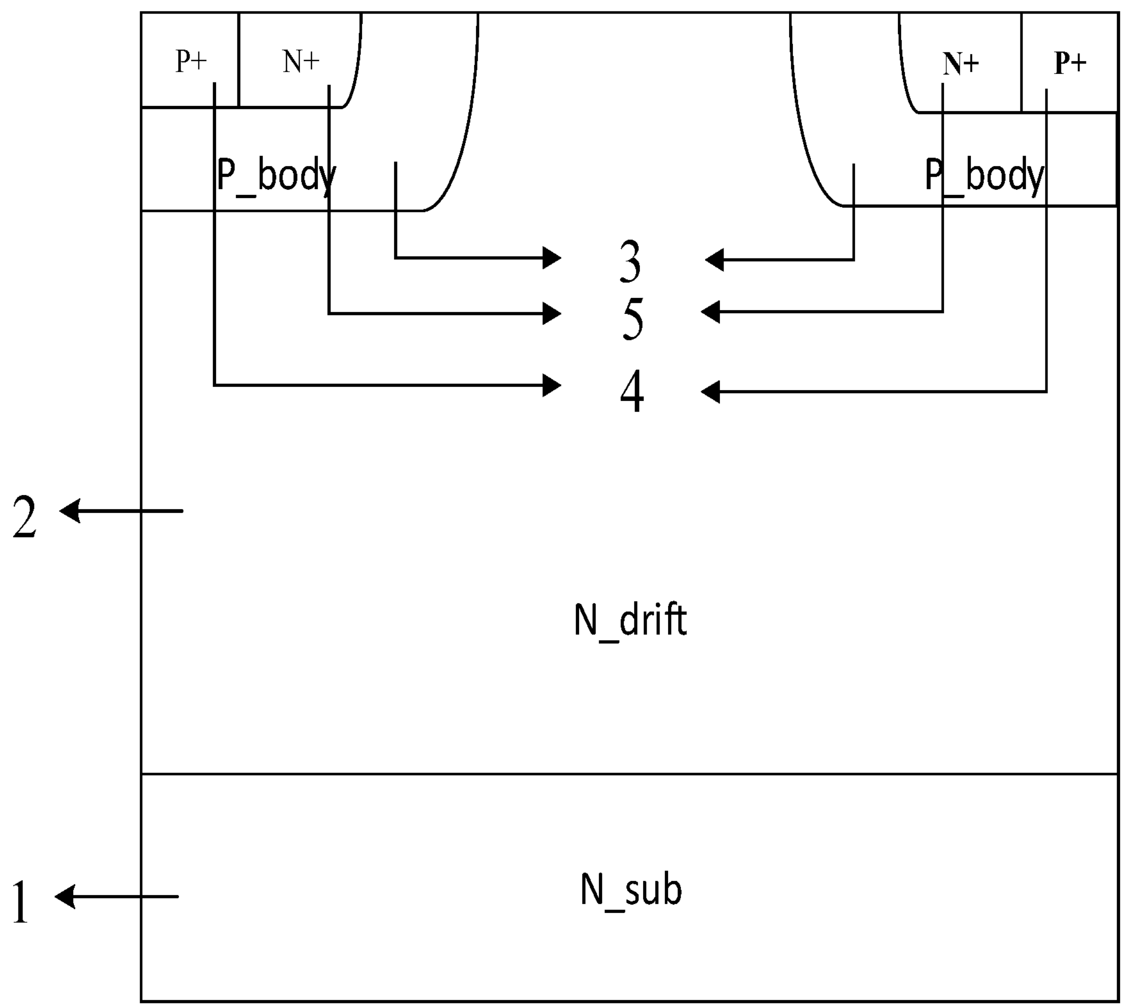
FIG. 11 is a structure diagram of N+-type source regions of the silicon carbide formed in the P-type body regions of the silicon carbide through photolithography and ion injection by the manufacturing method of the present invention.
Figure 12:
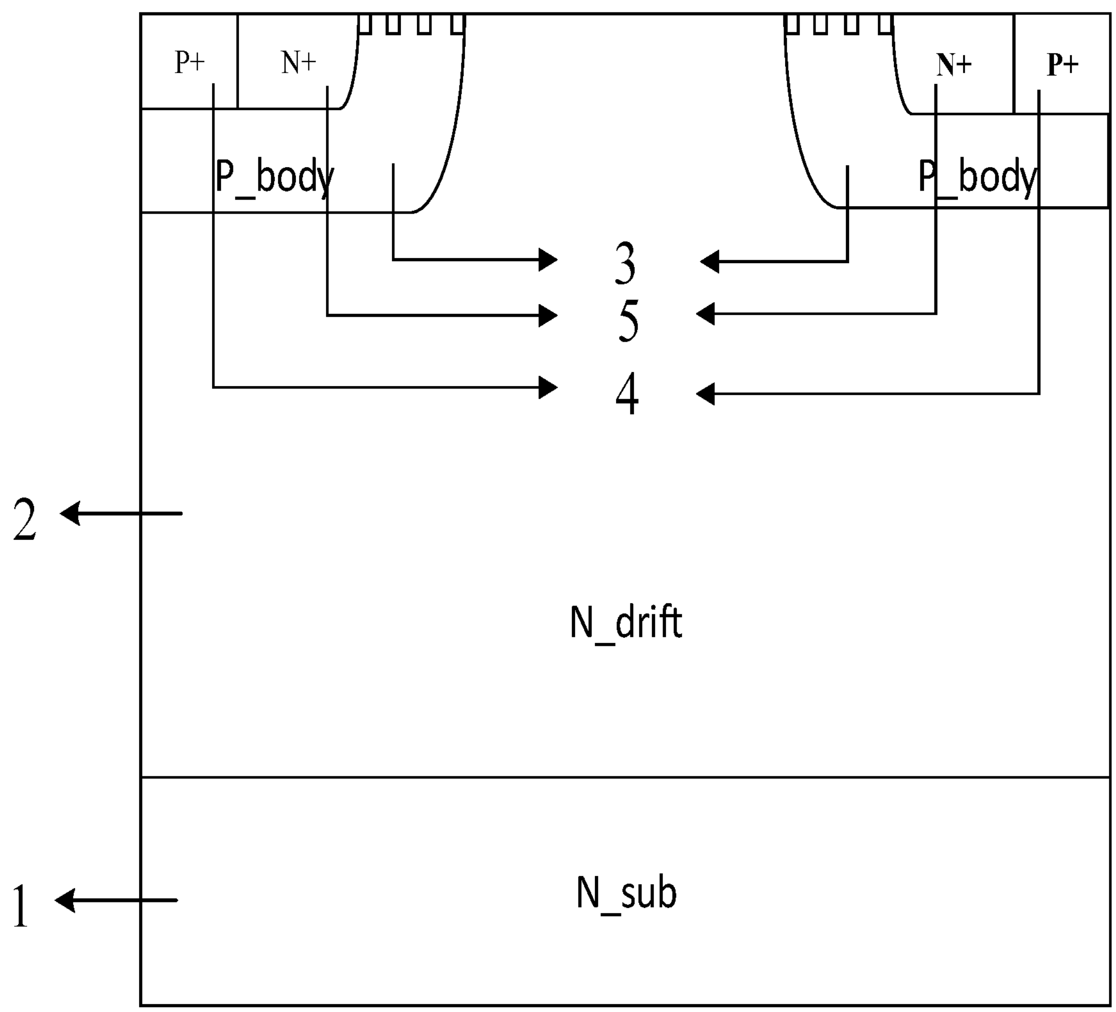
FIG. 12 is a structure diagram of graphene channels etched in the P-type body regions of the silicon carbide by the manufacturing method of the present invention.
Figure 13:
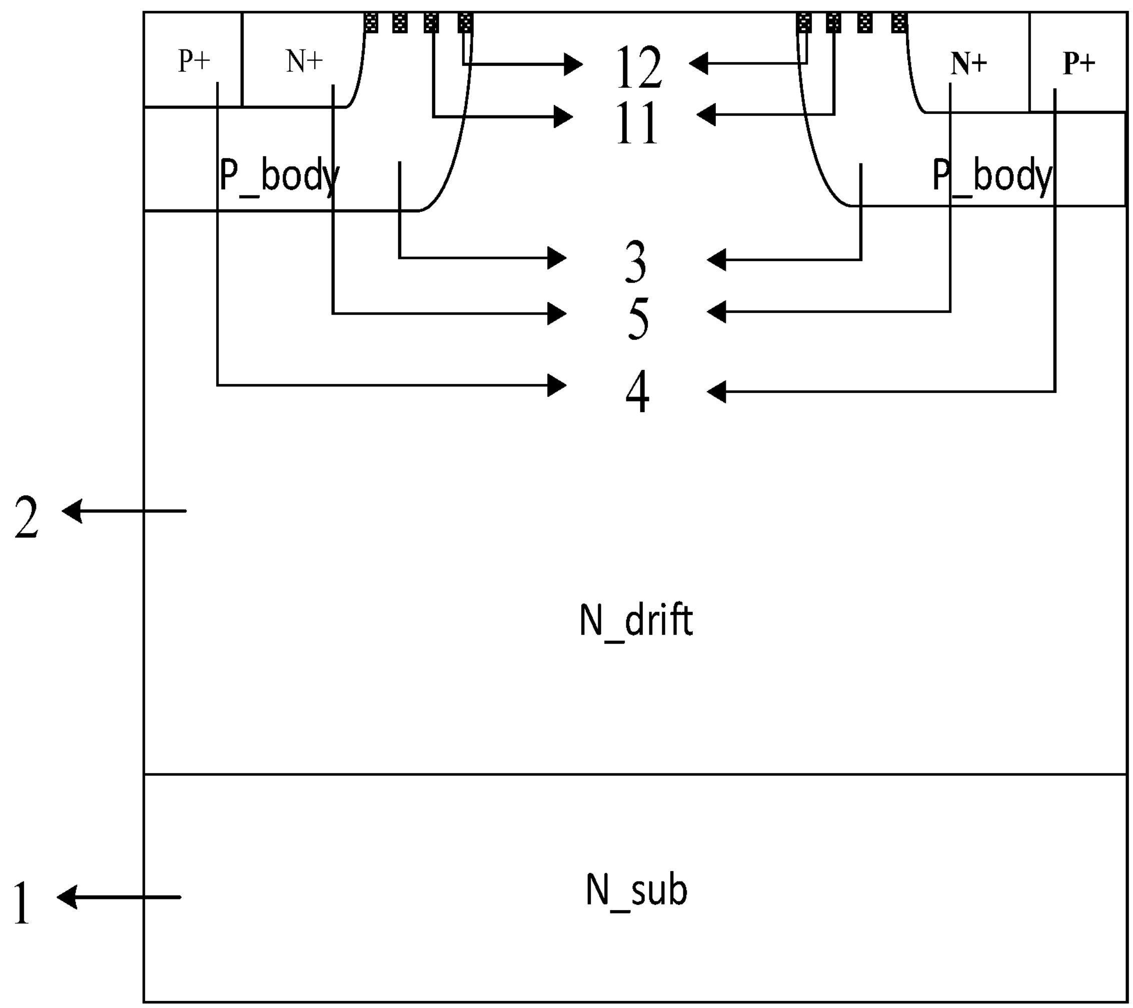
FIG. 13 is a structure diagram of a graphene array formed through deposition in the channels in the P-type body regions of the silicon carbide by the manufacturing method of the present invention.
Figure 14:
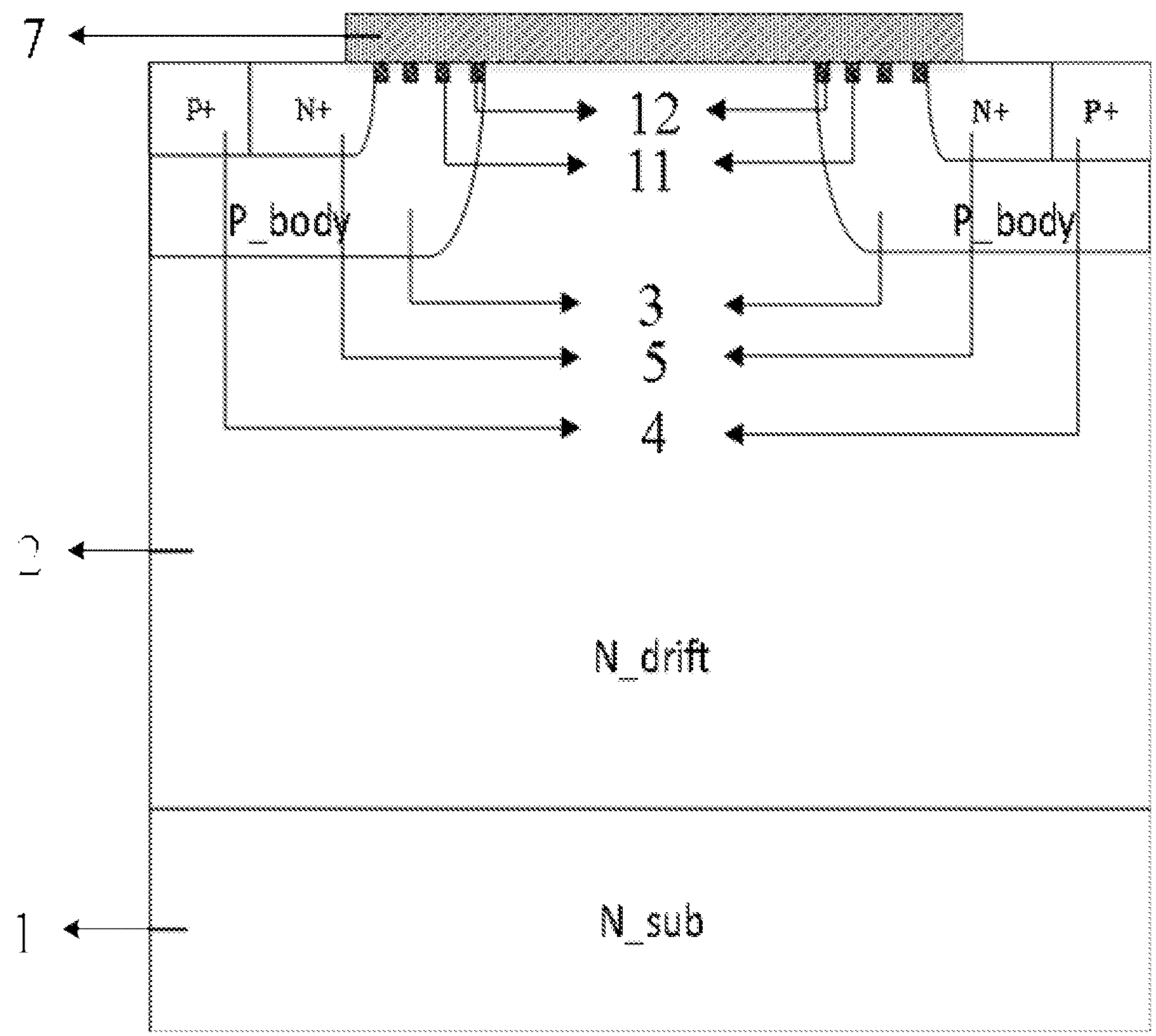
FIG. 14 is a structure diagram of a gate oxide formed on surfaces of the N-type drift region and the P-type body regions through thermal oxidation growth and etching by the manufacturing method of the present invention.
Figure 15:
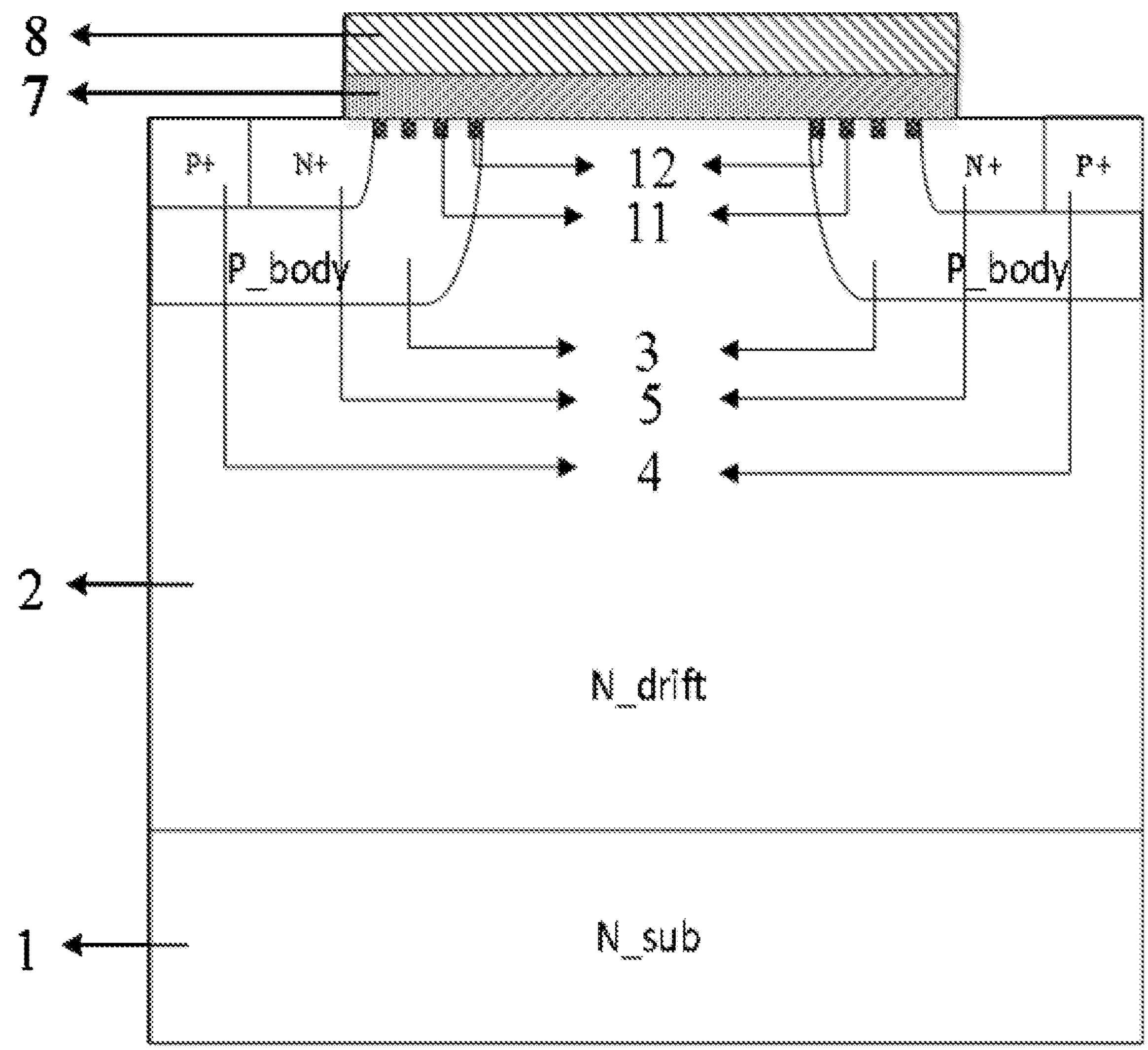
FIG. 15 is a structure diagram of a polysilicon gate deposited and etched on the gate oxide layer through deposition and etching by the manufacturing method of the present invention.
Figure 16:
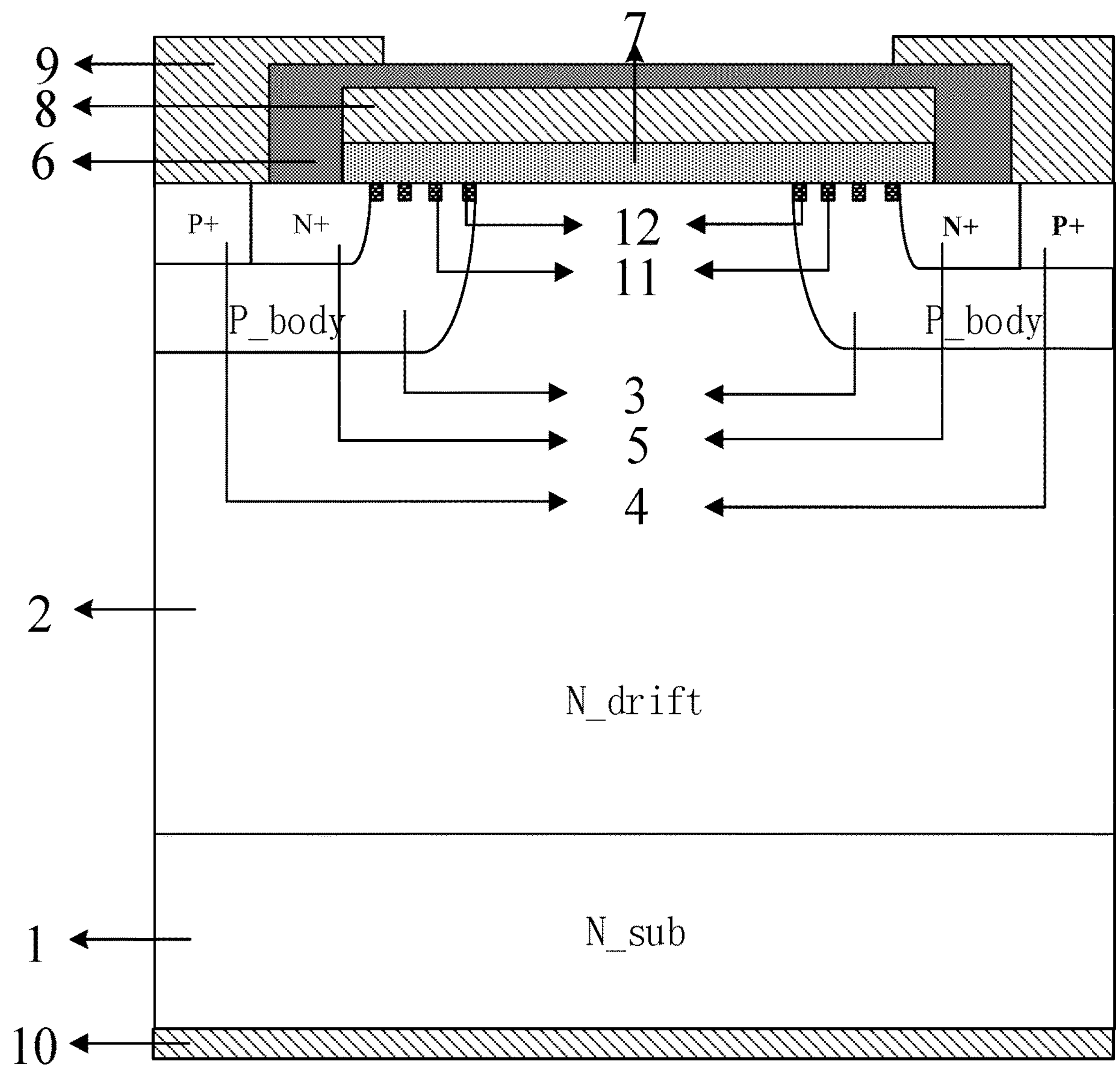
FIG. 16 is a structure diagram of a metal contact formed by deposition and metal etching, and then subjected to passivation treatment by the manufacturing method of the present invention.

A graphene channel silicon carbide power semiconductor transistor comprises an N-type substrate 1, wherein one side of the N-type substrate 1 is connected with a drain metal 10, and the other side of the N-type substrate 1 is provided with an N-type drift region 2, P-type body regions 3 are respectively arranged at two ends of the N-type drift region 2, a P+-type body contact region 4 and an N+-type source region 5 are respectively arranged in each of the P-body regions 3, a gate oxide layer 7 is arranged on a surface of the N-type drift region 2, and two ends of the gate oxide layer 7 are respectively extended into the P-type body regions 3 at the two sides, a polysilicon gate 8 is arranged on a surface of the gate oxide layer 7, a passivation layer 6 is arranged on the polysilicon gate 8, and the passivation layer 6 wraps two sides of the polysilicon gate 8, a source metal 9 is arranged on the N+-type source region 5 and the P+-type body contact region 4, a graphene strip 11 serving as a channel of the transistor is arranged in the P-type body region 3, and two ends of the graphene strip 11 are respectively contacted with a boundary between the N+-type source region 5 and the P-type body region 3 and a boundary between the P-type body region 3 and the N-type drift region 2, and the graphene strip 11 is embedded in a surface of the P-type body region 3. The graphene strip shall be broadly understood or interpreted. The graphene strip is relative to a monolithic graphene, can comprise or be interpreted as a monolithic hollow graphene, and can further comprise the following modes:

(1) the graphene strip 11 is cellular in a gate width direction, as shown in FIG. 3; and (2) the graphene strip 11 is a straight strip, as shown in FIG. 4.

In the embodiment, graphene blocks 12 can be respectively arranged in small regions of each of the P-type body regions 3 formed by dividing the P-type body region 3 with the graphene strip 11.

The present invention is described in detail below with reference to the drawings.

Example 1

A graphene channel silicon carbide power semiconductor transistor comprises an N-type substrate 1, wherein one side of the N-type substrate 1 is provided with a drain metal 10, and the other side of the N-type substrate 1 is an N-type drift region 2, a pair of P-type body regions 3 are arranged at two ends of the N-type drift region 2, a P+-type body contact region 4 and an N+-type source region 5 are respectively arranged in each of the P-type body regions 3, a gate oxide layer 7 is arranged on a surface of the N-type drift region 2, and two ends of the gate oxide layer 7 are respectively extended into the P-type body regions 3 at the two sides, a polysilicon gate 8 is arranged on a surface of the gate oxide layer 7, a passivation layer 6 is arranged on the polysilicon gate 8, and the passivation layer 6 wraps two sides of the polysilicon gate 8, and a source metal 9 is arranged on the N+-type source region 5 and the P+-type body contact region 4.

In the present embodiment: graphene embedded in the P-type body region 3 is extended from an intersection of the N+-type source region 5 and the P-body region 3 to the N-type drift region 5 at intervals in a gate length direction, and a graphene block 12 has a length of 0.1 μm, an interval of 0.1 μm and a thickness of 1 nm; and graphenes of a graphene strip 11 located at opposite angles in the gate width direction are interconnected, and distributed in a cellular manner.

Example 2

In the present embodiment, based on a traditional device structure, graphene embedded in the P-body region 3 is extended from an intersection of the N+-type source region 5 and the P-body region 3 to the N-type drift region 5 at intervals in a gate length direction, and a graphene block 12 has a length of 0.1 μm, an interval of 0.1 μm, and a thickness of 1 nm; and a graphene strip 11 is distributed continuously or at intervals in a gate width direction.

Compared with the device in the Example 2 with graphene distributed continuously or at intervals, the device in the first embodiment in cellular distribution with graphenes interconnected in the gate width direction has a lower on-resistance and a stronger current transmission capability. The cellular graphene makes a gap between the P-type body regions more obvious, an assisting depletion effect stronger, an off-state leakage current smaller, and a breakdown voltage higher. Therefore, the graphene channel silicon carbide power semiconductor device in cellular distribution has better overall performance.

The present invention is manufactured by the following method:

first step: growing a thicker epitaxial layer on a surface of an N-type substrate 1 to form an N-type drift region 2 by an epitaxial process;

second step: symmetrically injecting aluminum ions at two ends of the N-type drift region 2 to form a P-type body region 3 through photolithography and ion injection processes;

third step: injecting the aluminum ions into the P-type body region 3 to form a P+-type body contact region 4 through photolithography and ion injection processes;

fourth step: injecting phosphonium ions into the P-type body region 3 to form an N+-type source region 5 through photolithography and ion injection processes;

fifth step: etching and depositing a graphene array 11 in the P-type body region 3 through etching and deposition process;

sixth step: forming a gate oxide layer 7 above the P-body region 3, the graphene array 11 and the N-type drift region 2 through thermal oxidation or deposition and etching processes;

seventh step: depositing polysilicon above the gate oxide layer 7 and etching a polysilicon gate 8 through deposition and etching processes; and eighth step: depositing a metal layer on the surface of the device and etching an electrode contact region to lead out the electrode through deposition and etching processes, and finally performing passivation treatment.

What is claimed is:

1. A graphene channel silicon carbide power semiconductor transistor, comprising: an N-type substrate, wherein one side of the N-type substrate is connected with a drain metal, and the other side of the N-type substrate is provided with an N-type drift region, P-type body regions are respectively arranged at two ends of the N-type drift region, a P+-type body contact region and an N+-type source region are respectively arranged in each of the P-type body regions, a gate oxide layer is arranged on a surface of the N-type drift region, and two ends of the gate oxide layer are respectively extended into two sides of the P-type body regions, a polysilicon gate is arranged on a surface of the gate oxide layer, a passivation layer is arranged on the polysilicon gate, and the passivation layer wraps two sides of the polysilicon gate, a source metal is arranged on the N+-type source region and the P+-type body contact region, wherein a graphene strip serving as a channel of the transistor is arranged in the P-type body region, and two ends of the graphene strip are respectively contacted with a boundary between the N+-type source region and the P-type body region and a boundary between the P-type body region and the N-type drift region, and the graphene strip is embedded in a surface of the P-body regio.

2. The graphene channel silicon carbide power semiconductor transistor according to claim 1, wherein the graphene strip is cellular in a gate width direction.

3. The graphene channel silicon carbide power semiconductor transistor according to claim 2, wherein graphene blocks are respectively arranged in small regions of each of the P-type body regions formed by dividing the P-type body region with the graphene strip.

4. The graphene channel silicon carbide power semiconductor transistor according to claim 1, wherein the graphene strip is a straight strip.

5. The graphene channel silicon carbide power semiconductor transistor according to claim 4, wherein graphene blocks are respectively arranged in small regions of each of the P-type body regions formed by dividing the P-type body region with the graphene strip.

6. The graphene channel silicon carbide power semiconductor transistor according to claim 1, wherein graphene blocks are respectively arranged in small regions of each of the P-type body regions formed by dividing the P-type body region with the graphene strip.

* * * * *